United States Patent [19]

Holladay et al.

[11] 4,038,805

[45] Aug. 2, 1977

[54] METHOD AND APPARATUS FOR COILING AND PACKAGING ELECTRICAL CABLE

[75] Inventors: James F. Holladay; R. Emory Starnes, Jr.; Alvan E. Duke, all of Carrollton, Ga.

[73] Assignee: Southwire Company, Carrollton, Ga.

[21] Appl. No.: 643,921

[22] Filed: Dec. 23, 1975

[51] Int. Cl.² .................. B65B 63/04; B65B 57/00
[52] U.S. Cl. .................. 53/21 FW; 53/53; 53/118; 242/7.12
[58] Field of Search ............ 53/21 FW, 53, 54, 118; 242/7.12

[56] References Cited

U.S. PATENT DOCUMENTS

| | | | |
|---|---|---|---|
| 1,132,739 | 3/1915 | Scott | 242/7.12 |
| 2,922,519 | 1/1960 | Radley | 53/53 X |
| 3,738,078 | 6/1973 | Schaaf | 53/54 |

OTHER PUBLICATIONS

Davis – Standard Advertisement Wire Journal, Nov. 1972.
Davis – Standard Advertisement Brochure.

Primary Examiner—Travis S. McGehee
Attorney, Agent, or Firm—Van C. Wilks; Herbert M. Hanegan; Stanley L. Tate

[57] ABSTRACT

A method of and apparatus for automatically coiling predetermined lengths of multi-conductor electrical cable and packaging individually wound coils of cable are disclosed. A plurality of monitoring devices are arranged along the cable feed path to a coiling machine for continuously monitoring a number of selected parameters of the cable for defects and for generating fault signal outputs indicative of a predetermined variation from a standard value of the selected parameters. Successively wound coils are transferred from the coiling machine to a packaging machine where they are individually packaged, sealed and discharged. The fault signal outputs generated by the monitoring devices are transmitted to the packaging machine to automatically and positively identify a package containing a defective coil by disabling the package sealing mechanism. An electrical circuit is provided for discriminating between faults occurring in a coil being wound and faults occurring in a next successive coil to be wound.

11 Claims, 2 Drawing Figures

METHOD AND APPARATUS FOR COILING AND PACKAGING ELECTRICAL CABLE

BACKGROUND OF THE INVENTION

This invention relates generally to packaging coils of electrical cable, and more particularly to a method of and apparatus for automatically coiling and packaging a plurality of coils and for automatically identifying individual coils in which a fault exists.

In conventional methods of manufacturing packaged coils of non-metallic multi-conductor insulated building cable, a predetermined length of cable is coiled on a rotating mandrel of a coiling machine to form a finished coil or hank of cable. Either before or after coiling, the cable is tested in accordance with certain standard tests, such as electrical conductivity, cable size and insulation resistance, to determine whether the individual coils of the cable conform with approved standards, e.g., U.L. approved standards. One such test for electrical continuity is commonly known as a "bell" test and is normally conducted after the cable has been wound into a completed coil. To perform the bell test, an operator individually connects each conductor of the coil in series with a power source and an electrically energizable signalling means, such as a common door bell, electric lamp or the like. Thus, actuation of the signal means, i.e., an audible or visual signal, indicates electrical continuity of the conductor. After completion of the required tests, the individual coils are packaged for ultimate distribution to the consumer. It is apparent that the bell test alone requires considerable intervention of manual labor resulting in a substantial increase in the cost of the final product. Moreover, the bell test does not lend itself to high-speed, automatic production of packaged coils of multi-conductor electrical cable.

Machines are also known in the packaging art for automatically coiling predetermined lengths of wire and cable and for packaging the individual coils. In U.S. Pat. No. 2,914,897, for example, there is disclosed an apparatus for feeding a cable onto a packing sheet supported on a rotating coiling mandrel. A desired length of cable is wound onto the mandrel over a central portion of the packing sheet and the ends of the packing sheet are thereafter folded over the outer periphery of the coil circumference. While this apparatus is capable of automatically coiling and packing successive lengths of cable severed from an elongated cable element continuously fed to the apparatus, there are provided no in-line fault detection devices for performing tests of the aforementioned parameters of conductor continuity, cable size and insulation resistance and for automatically identifying in which particular coil a fault exists.

Also known in the prior art are apparatus for continuously testing a running length of non-metallic cable for electrical continuity, however, so far as it is known, such apparatus have not heretofore been utilized in combination with automatic wire coiling and packaging machines. One of the problems associated with using such electrical continuity testers in combination with an automatic cable coiling and packaging machine is the difficulty of discriminating in which of the individually wound and packaged coils a continuity fault exists. Interrupting the operation of the machine to remove the defective portion of cable would, of course, result in considerable loss of time and would be particularly disadvantageous in the high-speed in-line production system contemplated by the present invention.

SUMMARY OF THE INVENTION

In view of the foregoing, it should be apparent that there still exists a need in the art for an in-line automatic coiling and packaging machine for electrical cable wherein the cable is continuously monitored for faults and individual coils having a fault are automatically identified.

It has been found in accordance with the present invention that continuous coiling and packaging in non-metallic electrical cable could be achieved by performing the various required fault tests concurrently with the coiling operation and by providing a control circuit connected to a packaging apparatus and responsive to a fault signal for positively and automatically identifying a packaged coil which has failed at least one of the tests. Thus, the coiling and packaging apparatus of the present invention is capable of high-speed, uninterrupted operation which makes it particularly suitable for use with the high-speed tandem drawing and insulating system described in U.S. Pat. No. 3,852,875 issued to Mc Amis and Brewton, and assigned to the assignee of this invention. It is, tnerefore, a primary object of this invention to increase the production rate, improve the quality and reduce the cost of packaged coils of electrical cable.

More particularly, it is an object of this invention to provide an automatic coiling and packaging machine for electrical cable which can be integrated into a continuous, high-speed system for producing packaged coils for electrical cable.

Still more particularly, it is an object of this invention to provide an automatic coiling and packaging machine for electrical cable having means for continuously monitoring a selected parameter of the electrical cable to detect faults therein and means for automatically identifying individual coils of cable having a fault.

Another object of this invention is to provide an automatic coiling and packaging machine for electrical cable including means for monitoring a number of selected parameters of the cable for faults and means responsive to a detected fault in any one of the selected parameters for transmitting a signal to the packaging apparatus to identify a package containing a defective coil.

Yet another object of this invention is to provide a method of in-line continuous monitoring of selected parameters of an electrical cable for faults, automatically coiling and packaging predetermined lengths of the cable and identifying individual coils in which a fault exists.

Briefly described, these and other objects of the present invention are accomplished in accordance with its apparatus aspects by providing a hydraulic wire coiler having a retractable coiling drum upon which a predetermined length of a running electrical cable is wound, a retraction mechanism associated with the coiling drum for ejecting a completed coil of electrical cable from the drum, a wire shear for severing the coil from the running cable and a packaging machine which includes mechanisms for erecting a box or package, positioning the same to receive an individual ejected coil and sealing the box containing a coil of cable. In combination with the above apparatus, there are provided one or more devices for monitoring selected electrical and/or mechanical parameters of the running electrical cable as it is fed to the wire coiler. The monitoring devices may include, for example, an electrical continuity tester, an insulation resistance or "spark" tester and a cable size tester. Each monitoring device is capable of generating a fault signal output indicative of a predetermined deviation from a standard value of the selected parameter. The monitoring devices are connected via a control circuit to the packaging machine to disable the sealing mechanism thereof upon the detection, by any one of the monitoring devices, of a fault in the running electrical cable. Thus, a box or package issuing from the packaging machine in an unsealed condition is readily identifiable as containing a defective coil of cable. Such packages may then be manually removed from the production line and scrapped or reworked as desired.

Since the monitoring devices are most conveniently located at spaced positions along the feed path of the running cable before the input to the coiling drum, it is essential to control the box sealer disabling function in a manner which will discriminate between a fault occuring in a coil which is being wound on the coiling drum and a fault occuring in the next successive coil to be wound. This control is provided in accordance with the invention by a footage counter which not only measures off predetermined lengths of cable for each coil and controls other functions of the coiler machine, but also generates signals in response to measured incremental lengths of the cable to enable transmission of the fault signal output to the sealer mechanism at an appropriate time in the operational sequence.

The method aspects of the invention are accomplished by automatically coiling and packaging predetermined lengths of a running electrical cable, continuously monitoring selected electrical and mechanical parameters of the running length of cable to detect faults therein and by generating a fault signal which is subsequently transmitted to the packaging machine to disable a package sealing mechanism and prevent the sealing of a package containing a defective coil of cable.

With these and other objects, and advantages and features of the invention that may become hereinafter apparent, the nature of the invention may be more clearly understood by reference to the following detailed description of the invention, the appended claims and to the several views illustrated in the attached drawings wherein:

DETAILED DESCRIPTION OF A PREFERRED EMBODIMENT

Figure 1:
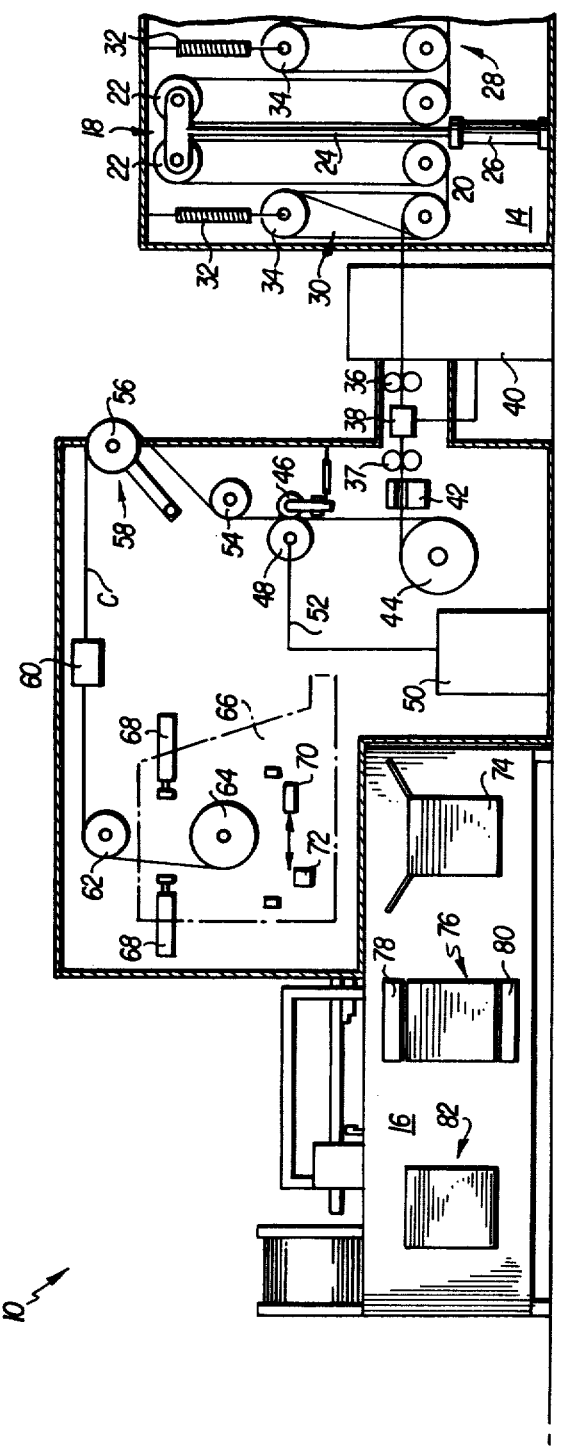
FIG. 1 is a schematic side view of a coiling and packaging machine according to the invention.

Referring now in detail to the drawings wherein like parts are designated by like reference numerals throughout, there is illustrated in FIG. 1 a coiling and packaging machine constructed in accordance with the invention and designated generally by reference numeral 10. The coiling and packaging apparatus comprises essentially three interrelated assemblies, a coiler assembler 12, accumulator assembly 14 and boxer assembly 16, arranged generally in-line to receive a running indeterminate length of multi-conductor insulated electrical cable designated C. The coiler assembly 12 is a conventional single arbor hydraulically-operated wire coiler which functions to wind predetermined lengths of cable into individual coils. The accumulator assembly 14 is a multi-sheave accumulator located upstream of the coiler assembly 12 and functions to provide storage for incoming cable when the coiler is stopped during cutover between successive coiling operations. The boxer assembly 16 is located downstream of the coiler assembly 12 and functions to erect and position a box for receiving a completed coil ejected from the coiler and to seal the box to form a coil package.

The accumulator assembly 14 includes a center section comprising a vertical air spring dancer assembly 18 which provides cable storage capability during the cut-over cycle. The dancer assembly 18 is made up of thirty sheaves, the lower sheaves 20 being rotatably mounted in stationary vertical position and the upper sheaves 22 being rotatably mounted to the end of vertically movable piston 24 of a pneumatic cylinder 26. During the cut-over or cable accumulation period, cable tension is provided by a preset air pressure to the pneumatic cylinder 26 of the dancer. During winding of a coil on the coiler assembly 12, however, cable tension is the sum of the tension resulting from the winding of the coil and the tension created by the dancer. To maintain a substantially constant tension on the cable during both winding and the cut-over cycle, the air pressure in the cylinder 26 is automatically controlled to exhaust during winding.

Two vertical buffer accumulators 28, 30 are positioned at the input and output respectively of the dancer assembly 18 to isolate abrupt variations in cable speed and tension. Cable tension is provided at the buffer accumulators by resilient springs 32 which are connected to the upper movable sheaves 34 of the buffer accumulator.

The cable C passes from the output buffer accumulator 30 to the coiler assembly 12 via a set of entrance guide roller pairs 36, 37. Located between the roller pairs are sensor coils 38 of an electrical continuity tester 40 which is operatively connected to the boxer assembly 16 in a manner to be further described hereinbelow. The continuity tester 40 is preferably an eddy current inspection instrument for detecting defects in rod and tube without physically contacting the element being tested. One commercially available instrument suitable for use with the apparatus of the present invention is manufactured by Magnaflux Corporation under the designation MAGNATEST FW-400 Series. Such instruments and their operation are well-known to those skilled in the art and, therefore, need not be further disclosed herein.

As the cable C exits the roller pair 37, it passes through a cable clamp 42 which is closed during cut-over to prevent pull-back of the cable onto the accumulator. The cable then passes about a brake sheave 44 and to a cable size tester 46, the output of which is also operatively connected to the boxer assembly 16 as will be hereinafter described. Adjacent the cable size tester 46 there is located a measuring wheel 48 which incrementally measures the length of cable C passing through the coiler and transmits output pulses proportional to the measured cable length to a control counter 50 via an electrical connection 52.

From the measuring wheel 48 the cable passes over an idler sheave 54, sheave 56 of a cable retract mechanism 58 and thence through the sensor of a conventional sine wave spark tester 60 for detecting insulation faults to the cable. The output of the spark tester 60 is also transmitted to the boxer assembly 16. The cable then travels about an axially movable traversing pulley 62 and is wound onto a coiling drum 64. The coiling drum 64 is inwardly retractable to eject a completed coil and outwardly extended to clamp a cable starting end between the end of the drum and a front plate 66 (shown in phantom). Hydraulically operated cable positioners 68 are located on either side of the cable passing between the traversing pulley 62 and coiling drum 64 and are operable to align the cable starting end with the retracted drum. A cable locater 70 is mounted below the coiling drum 64 and is hydraulically actuated after ejection of a wound coil to position the cable in front of a shearing mechanism 72 which serves the completed coil from the cable.

Ejected coils drop from the coiling drum 64 into an open box or case 74 which has been formed and upended into a position beneath the drum by the boxer assembly 16 in a well-known manner. Cases loaded with coils are advanced successively along the boxer assembly 16 to a central sealing station 76 which includes upper and lower case sealer units 78, 80 respectively and thence to a compression station 82 where the upper and lower outer case flaps are tucked and the case is compressed and discharged from the boxer assembly 16.

After completion of a coil is signalled by the control counter, the cut-over is initiated by braking the coiler drive (not shown). When the coiling drum 64 stops rotating, it is retracted and the completed coil is ejected and drops by gravity into the open box 74 positioned in the boxer assembly beneath the drum. The cable locater 70 is actuated to move to the left as seen in FIGS. 1, takes up the cable extending between the traversing pulley 62 and the completed coil and aligns the cable with the shearing mechanism 72. The shearing mechanism 72 functions to sever the cable and retracts, along with the cable locater 70. The cable retract mechanism 58 pivots clockwise and pulls the severed end (starting end) of the cable upwardly to the approximate height of the coiling drum 64. The cable positioners 68 move toward each other to center the cable with the drum. With the cable starting end now in position for the commencement of another winding operation, the control counter 50 is reset, the coiling drum 64 extends outwardly to engage the cable starting end with the front plate 66 and the cable positioners 68 are retracted. Thereafter, the coiler drive brake is released and as the coiling drum begins to rotate, the cable retract mechanism 58 rotates counterclockwise to its normal position.

If, during the winding of a coil, any one of the monitoring devices, i.e., the continuity tester 40, cable size tester 46 or spark tester 60, indicates a defect in the cable and generates a fault signal, the signal will be transmitted to the sealer units 78, 80 of the boxer assembly 16 to disable the sealing function and thus, identify a case containing a defective coil. With this arrangement, it is possible, for example, that a fault could be detected substantially simultaneously with the completion of a coil and a fault signal generated. However, since the monitoring devices are positioned upstream of the coiling drum at spaced locations along the cable feed path, the fault would exist in a subsequently wound coil and not in the just completed coil. This problem is overcome by the present invention which takes into account the spacing of the individual monitoring devices from the point at which the cable is severed. By appropriate logic circuitry, discrimination between defects occurring in a coil being wound on the coiling drum 64 and defects occurring in a next successive coil to be wound is possible.

Figure 2:
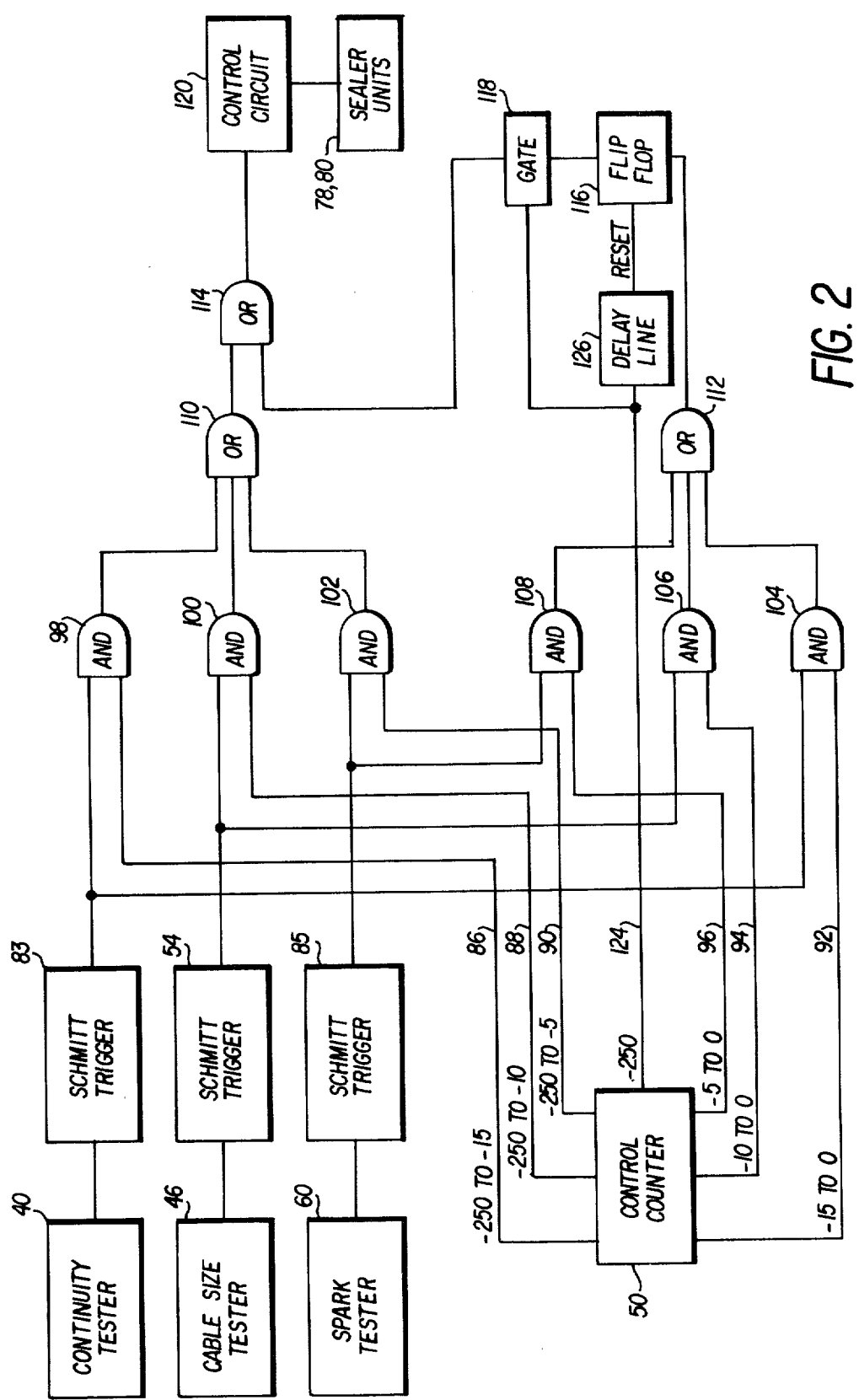
FIG. 2 is a schematic diagram of the logic circuitry for identifying a package containing a defective coil.

Now referring to FIG. 2, there is diagrammatically illustrated a preferred embodiment of logic circuitry suitable for accomplishing the aforementioned discrimination between coils. For purposes of illustration, it will be assumed that the predetermined lengths of the coils to be wound are standard 250 foot lengths and that the various monitoring devices are located at successive 5 foot intervals from the cable shearing mechanism 72. Thus, the continuity tester 40 is assumed to be 15 feet, the cable size tester 46 to be 10 feet and the spark tester 60 to be 5 feet respectively from the shear mechanism 72. Further, it will be assumed that the control counter 50 counts from a negative value, e.g., minus 250 to zero, and is internally reset to minus 250 upon arriving at a zero count.

The counter 50 generates a plurality of digital output signals corresponding to the incremental length of the cable as measured by the measuring wheel 48 (FIG. 1) and which are utilized to enable various other elements of the logic circuitry. These output signals appear at output leads 86–96 of the control counter 50 and are connected to one input of respective AND gates 98–108. The output signals generated are enabling, e.g., ON, and disabling, e.g., OFF, at each output lead in response to increments of the measured cable length in accordance with Table I. hereinbelow:

TABLE I

| Output Lead | ON | OFF |
| --- | --- | --- |
| 86 | −250 to −15 | −14 to 0 |
| 88 | −250 to −10 | −9 to 0 |
| 90 | −250 to −5 | −4 to 0 |
| 92 | −15 to 0 | −250 to −16 |
| 94 | −10 to 0 | −250 to −11 |
| 96 | −5 to 0 | −250 to −6 |

The fault signal of the continuity tester 40 is connected via a threshold circuit which may be, for example, a Schmitt trigger 83 to the other inputs of the AND gates 98 and 104; the fault signal output of the cable size tester 46 is connected via a Schmitt trigger 84 to the other inputs of AND gates 100 and 106; and the fault signal output of the spark tester 60 is connected via a Schmitt trigger 85 to the other inputs of AND gates 102 and 108. The outputs of AND gates 98–102 are applied to an OR gate 110 and the outputs of AND gates 104–108 are applied to OR gate 112.

The output of OR gate 110 is applied to another OR gate 114 while the output of OR gate 112 is transmitted via a storage flip-flop 116 and gate circuit 118 to OR gate 114. If an output signal appears at the output of OR gate 114 it will be applied to a control circuit 120 which functions to interrupt the gluer cycle of the upper and lower sealer units 78, 80 for the next coil package to be cycled through the central sealing station 76 (FIG. 1). The control counter 50 is also provided with a lead 124 which transmits an output signal when the counter is reset to minus 250. This output signal is applied to gate 118 and to flip-flop 116 via a delay line 126. The portion of the logic circuit which includes outputs 92–96, AND gates 104–108, OR gate 112, flip-flop 116 and gate 118 may be described as the "storage portion" of the circuit and enables the coiling and packaging apparatus of the present invention to store a fault signal from any one of the monitoring devices during the cut-over cycle between successively wound coils.

The above-described logic circuit operates to discriminate between faults occurring in successively wound coils in the following manner. At the start of the winding operation with the control counter 50 reset to minus 250 and the coiling drum 64 engaging the cable starting end and assuming no prior fault has been indicated, 15 feet of cable have travelled past the continuity tester 40, 10 feet of cable past the cable size tester 46 and 5 feet of cable past the spark tester 60. As the coiling drum begins to rotate, the pulses from the measuring wheel 48 initiate the count from minus 250, the signals to AND gates 98, 100, 102 are ON and the signals to AND gates 104, 106, 108 are OFF. When the control counter 50 counts to minus 15, 250 feet of cable, representing the total length of cable to be wound on the coil, have been monitored for continuity faults and the output signal on lead 86 is OFF thereby disabling AND gate 98. In a similar manner AND gates 100 and 102 will be disabled at counts of minus 10 and minus 5 respectively. Should a fault signal from any one of the monitoring devices occur during the respective periods of enablement of AND gates 98, 100, 102, a signal will be applied to OR gates 110, 114 and the control circuit 120 to disable the gluing cycle of the sealer units 78, 80 for the next coil package to be sealed, i.e., the coil being wound on the coiling drum.

Substantially simultaneously with the disabling of AND gate 98, the signal output at lead 92 will enable AND gate 104 and, similarly, the signal outputs at leads 94, 96 will enable AND gates 106, 108 when AND gates 100, 102 are disabled. Thus, a fault signal from the monitoring devices during the respective periods of enablement of AND gates 104, 106, 108, will be applied to OR gate 112 which will, in turn, "store" the signal in flip-flop 116. When the counter counts to zero and resets to minus 250, the signal at lead 124 is applied to gate 118 which transmits the "stored" signal at flip-flop 116 to OR gate 114 and control circuit 120 to disable the gluing cycle of the sealer units 78, 80 for the next coil package to be sealed which, in this instance, is the next successive coil to be wound on the coiling drum. The signal at lead 124 is also applied through delay line 126 to reset flip-flop 116 to its normal OFF condition.

It is to be understood that the present invention is not intended to be limited by the particular circuitry illustrated and described herein, nor by the specific means with which descrimination of coil faults is achieved. For example, it is possible to identify packages containing a defective coil by means other than by disabling the case sealer units and other electrical circuits, analog as well as digital, could be utilized to provide discrimination of coil faults. Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method of coiling and packaging an electrical cable comprising the steps of:
   feeding said cable to a coiling apparatus;
   continuously monitoring a selected parameter of said cable during feeding of said cable to said coiling apparatus;
   generating a fault signal indicative of a predetermined deviation from a standard value of the selected parameter of said cable;
   continually measuring predetermined lengths of said cable;
   coiling successive ones of a plurality of individual coils of said predetermined length;
   positioning a package receptacle for receiving an individual cable coil;
   continually severing said individual coils from said cable after coiling thereof;
   transferring the individual cable coil to said package receptacle;
   transferring said package receptacle containing the cable coil to a sealer unit for sealing said package receptacle;
   automatically discriminating between a fault signal generated by reason of a fault in an individual coil transferred to said package receptacle and a fault signal generated by reason of a fault in a next successive coil to be wound;
   transmitting said discriminated fault signal to said sealer unit; and
   disabling the sealer unit in response to said transmitted fault signal to prevent sealing of said package receptacle only when a fault exists in the cable coil contained in said receptacle.

2. The method according to claim 1 wherein said monitoring step includes monitoring any one of the parameters of electrical continuity, cable size and insulation resistance.

3. The method according to claim 1, wherein said sealer unit comprises a glue sealing unit and said disabling step includes disabling the gluing cycle of said glue sealing unit.

4. Apparatus for coiling and packaging a predetermined length of electrical cable from a running indeterminate length of said cable comprising:
   means for continuously feeding a running length of electrical cable along a cable feed path;
   means for continuously monitoring a selected parameter of said running length of cable and for generating a fault signal indicative of a predetermined deviation from a standard value of said parameter;
   means for measuring predetermined lengths of said cable;
   means for continually coiling successive ones of a plurality of individual coils of said predetermined length;
   means arranged downstream of and spaced from said monitoring means for continually severing said individual coils from said running length of cable;
   means for ejecting said individual coils from said coiling means;
   means for packaging the individual coil ejected from said coiling means, said packaging means including means for positioning a package receptacle for receiving the ejected coil therein and means for sealing said package receptacle; and
   means transmitting said fault signal to said sealing means, said transmitting means including means for discriminating between a fault signal generated by reason of a fault in an individual coil severed from said cable and a fault signal generated by reason of a fault in said cable upstream of said severing means said transmitting means disabling the sealing cycle of said sealing means to prevent sealing of said package receptacle only when the fault exists in the individual coil contained in said receptacle.

5. Apparatus according to claim 4, wherein the selected parameter includes any one of the parameters of electrical continuity, cable size and insulation resistance.

6. Apparatus according to claim 4, wherein said sealing means comprises a glue sealing unit, said transmitting means being connected to said glue sealing unit to disable the gluing cycle thereof.

7. Apparatus according to claim 4, wherein said measuring means has an output indicative of the incremental length of said predetermined length of cable, said discriminating means being connected to said responsive to the output of said measuring means, said discriminating means enabling transmission of said fault signal to said sealing means prior to the measurement by said measuring means of a preset incremental length of said predetermined length of cable and inhibiting transmission of said fault signal to said sealing means subsequent to the measurement by said measuring means of said present incremental length to thereby discriminate between a coil being wound by said coiling means and a next successive coil to be wound by said coiling means.

8. Apparatus according to claim 7, wherein said predetermined length of said cable is substantially equal to the sum of said present incremental length and the spacing between said severing means and said monitoring means.

9. Apparatus according to claim 4, wherein said monitoring means includes a continuity tester, a cable size tester and a spark tester arranged in spaced relation to one another and upstream of said severing means, said discriminating means including logic circuit means connected to each of said testers and to said measuring means for enabling and disabling transmission of said fault signal to said sealing means in a predetermined sequence dependent on the spacing between said severing means and a respective one of said testers.

10. Apparatus according to claim 9, wherein said logic circuit means includes means for storing said fault signal generated by reason of a fault in said cable upstream of said severing means.

11. Apparatus according to claim 4, wherein said coiling means includes a coiling drum movable between extended and retracted positions and including cable positioner means arranged above said coiling drum for engaging said cable adjacent an upstream severed end thereof and for aligning said upstream severed end with coiling drum when said coiling drum is moved from its retracted position to its extended position.

* * * * *